United States Patent

Kawasaki et al.

[11] Patent Number: 5,250,819
[45] Date of Patent: Oct. 5, 1993

[54] LIGHT EMITTING DEVICE HAVING STEPPED NON-NUCLEATION LAYER

[75] Inventors: Hideji Kawasaki, Yamato; Hiroyuki Tokunaga, Kawasaki, both of Japan

[73] Assignee: Canon Kabushiki Kaisha, Tokyo, Japan

[21] Appl. No.: 866,480

[22] Filed: Apr. 10, 1992

[30] Foreign Application Priority Data

Apr. 15, 1991 [JP] Japan ................. 3-108124

[51] Int. Cl.$^5$ ............................ H01L 33/00
[52] U.S. Cl. ........................ 257/88; 257/91; 257/99; 257/773; 437/905
[58] Field of Search ............... 257/99, 88, 91, 93, 257/773, 774, 775; 437/904, 905, 906

[56] References Cited

U.S. PATENT DOCUMENTS

| | | | |
|---|---|---|---|
| 4,074,299 | 2/1978 | Kusano et al. | 257/93 |
| 4,768,070 | 8/1988 | Takizawa et al. | 257/99 X |
| 4,924,276 | 5/1990 | Heime et al. | 257/99 |

FOREIGN PATENT DOCUMENTS

| | | |
|---|---|---|
| 0241316 | 10/1987 | European Pat. Off. |
| 0285358 | 10/1988 | European Pat. Off. |
| 0339793 | 11/1989 | European Pat. Off. |
| 59-168671 | 9/1984 | Japan. |
| 60-08384 | 3/1985 | Japan. |
| 63-239920 | 10/1988 | Japan. |
| 125765 | 5/1990 | Japan. |
| 2201975 | 8/1990 | Japan .................. 257/88 |
| 3006856 | 1/1991 | Japan. |
| 3006858 | 1/1991 | Japan. |

OTHER PUBLICATIONS

Japan Pat. Abstract, vol. 9, No. 19 (E-292) published Jan. 25, 1985.

*Primary Examiner*—William Mintel
*Attorney, Agent, or Firm*—Fitzpatrick, Cella, Harper & Scinto

[57] ABSTRACT

A light emitting device includes a non-nucleation layer on which a step is formed to define a non-nucleation surface. Compound semiconductor islands, each consisting of n-type and p type semiconductor regions, are formed along a wall surface constituting the boundary of the step, and outer and inner electrodes are formed thereon, with the wiring section for the outer electrodes being formed on the surface of the non-nucleation layer which is at a level higher than the non-nucleation surface. The electrodes and the electrode wiring section are positioned substantially at the same level, thus attaining a reduction in resistance value and an increase in strength.

6 Claims, 10 Drawing Sheets

LIGHT EMITTING DEVICE HAVING STEPPED NON-NUCLEATION LAYER

BACKGROUND OF THE INVENTION

1. Field of the Invention

The present invention relates to a light emitting device (LED) and, in particular, to an electrode wiring section of a light emitting device.

2. Description of the Related Art

A conventional LED array head for an electrophotographic printer is disclosed, for example, in Japanese Patent Laid-Open No.60-48384, according to which the LED array head comprises LED arrays prepared on compound-semiconductor-monocrystal substrates each having a length of approximately 1 to 2 cm, and these LED arrays are arranged on a support substrate and adhered thereto.

Figure 26:
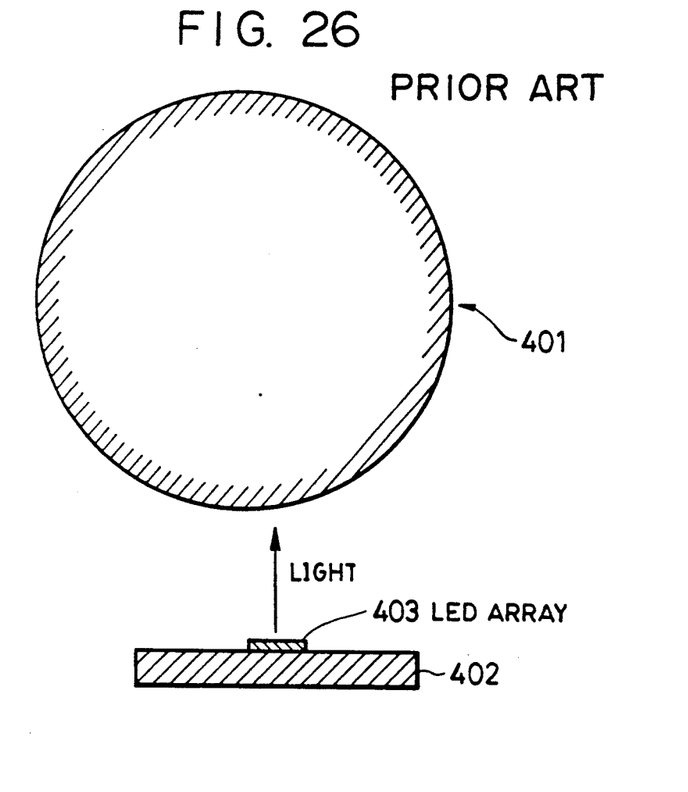
FIG. 26 is a side view showing the positional relationship between an LED array head and a photosensitive drum in a prior-art example.

FIG. 26 shows such a conventional LED array head comprising multiple LED arrays 403 which are arranged in a row on a support substrate 402 and adhered thereto. It is necessary to ensure a large space around the photosensitive drum 401 for the installation of the LED array head.

As a means for eliminating the need for such a large space, a structure has been proposed in which the monocrystal substrates are arranged such that the emission of light is effected in a direction parallel to the support substrate, with the support substrate being held perpendicular to the peripheral surface of the photosensitive drum (Japanese Patent Laid-Open No. 2-125765). With this structure, however, the mounting operation takes a long time since a large number of small compound-semiconductor-monocrystal substrates have to be arranged on the support substrate and adhered thereto while setting their optical axes in alignment with each other. Furthermore, the interval between the light emitting elements and the light emission intensity in the joint sections are liable to be rather uneven.

As a solution of this problem, the present inventors proposed a semiconductor device prepared by using a selective nucleation method.

According to the selective nucleation method, crystal growth is effected on a substrate having a free surface on which are arranged side by side the surface of an amorphous or polycrystalline non-nucleation layer having a small nucleation density, and parts of the surface of an amorphous or polycrystalline nucleation layer having a nucleation density larger than that of the non-nucleation layer, each of the parts of the latter surface having an area small enough for crystal growth to be effected starting from a single nucleus. Crystals are grown on this substrate, each starting from a single nucleus. With the selective nucleation method, however, crystal-growth conditions which will increase the monocrystallization factor lead to a deterioration in the occupation factor, whereas crystal-growth conditions which will increase the occupation factor lead to a deterioration in the monocrystallization factor. As a means for avoiding this dilemma, the present inventors also separately have proposed a selective semiconductor-device formation method using polycrystals.

Figure 27:
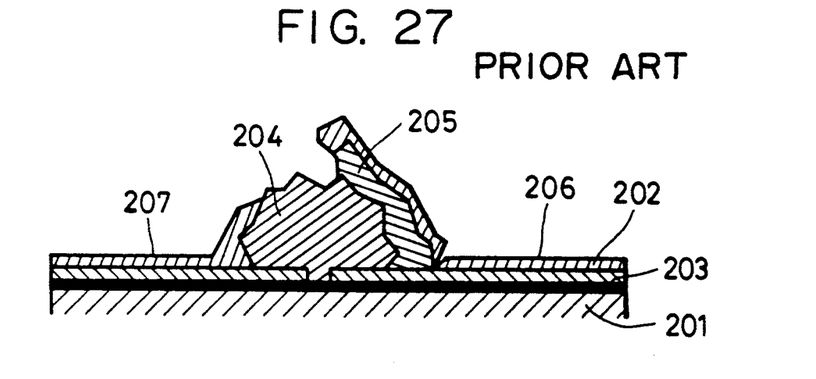
FIG. 27 is a sectional view of a conventional light emitting device formed by the selective nucleation method.

FIG. 27 is a sectional view of a light emitting device prepared by the selective nucleation method.

A nucleation layer 203 is formed by evaporation on a heat resistant substrate 201, and a non-nucleation layer 202 is deposited on the nucleation layer 203 by evaporation. The non-nucleation layer 202 is then partly removed to expose parts of the nucleation layer 203. Then, a p-type semiconductor region 204 is formed by crystal growth around each of the exposed parts of the nucleation layer 203. Further, an n-type semiconductor region 205 is formed on each p-type semiconductor region 204 by crystal growth. An electrode 207 is connected to each p-type semiconductor region 204, which is situated on the inner side, and an electrode 206 is connected to each n-type semiconductor region 205, which is situated on the outer side.

A problem with the light emitting device formed by the conventional selective nucleation method, described above, is that there is a difference in level between the semiconductor crystal islands and the substrate surface on which the electrode wiring is provided for the electrodes outside the light emitting regions, with the result that the electrode wiring is liable to suffer disconnection.

SUMMARY OF THE INVENTION

It is an object of the present invention to provide a light-emitting-device structure having an outer electrode wiring which is relatively resistant to disconnection in the course of fabrication by the selective nucleation method.

The invention in one aspect pertains to a light emitting device comprising a non nucleation base layer including a first layer portion having an arbitrarily determined thickness as measured from a bottom surface of the first layer portion, a second layer portion having thickness greater than that of the first layer portion, and a wall surface connecting the first and second layer portions, thereby forming a step; a plurality of compound semiconductor crystal islands grown along the first layer portion and the wall surface, the growing starting either from a point on the first layer portion adjacent to the wall surface or on the wall surface; a plurality of light emitting regions formed on areas corresponding to concentric circles around the locations at which the compound semiconductor crystal islands are grown; electrodes disposed outside the light emitting regions, thereby forming electrode regions; and a wiring section formed on the second portion.

In the above construction, the difference in level between the electrode regions outside the compound semiconductor crystal islands and the substrate surface on which the electrode wiring is provided is reduced, so that the electrode wiring is relatively resistant to disconnection.

DETAILED DESCRIPTION OF THE PREFERRED EMBODIMENTS

Embodiments of the present invention will now be described with reference to the accompanying drawings.

Figure 1:
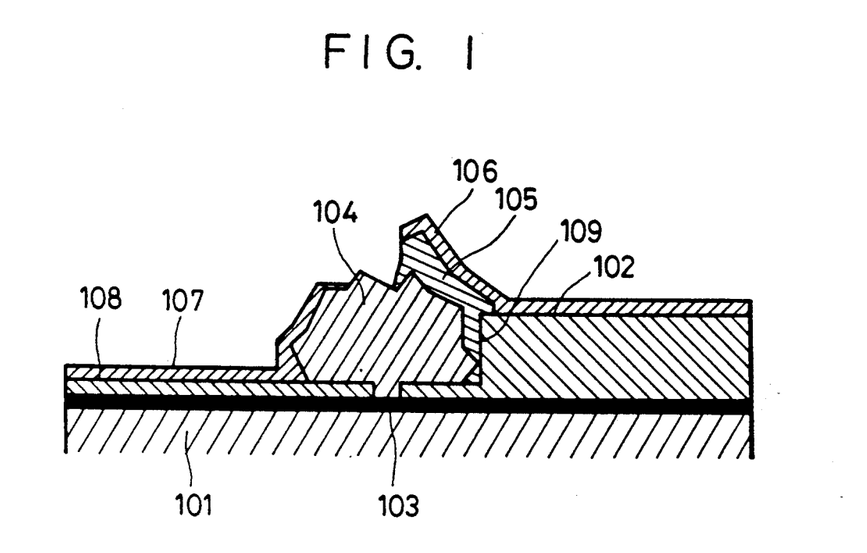
FIG. 1 is a sectional view of a light emitting device according to a first embodiment of the present invention.

FIG. 1 is a sectional view of a light emitting device according to the first embodiment of the present invention; and FIGS. 2 to 7 are sectional views illustrating fabrication steps for the light emitting device shown in FIG. 1.

Figure 2:
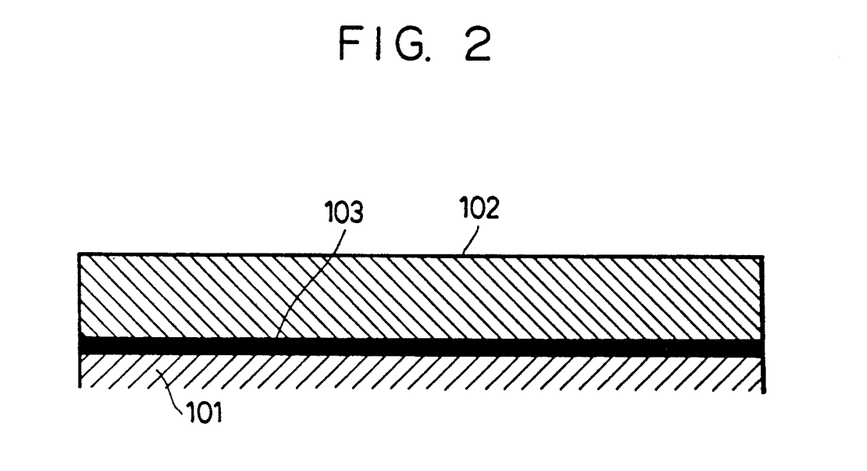
FIG. 2 is a sectional view of amorphous layers deposited on a substrate.

This embodiment, which has the fundamental structure of the light emitting device of the present invention, comprises: a heat resistant substrate 101; a non-nucleation layer 102, 108 comprising layer portions having different thicknesses; a wall surface 109 connecting the layer portions of the non-nucleation layer 102, 108 and thereby forming a step; a plurality of semiconductor crystal islands formed on the non-nucleation layer portion 108 so as to be arranged in the longitudinal dimension of the heat resistant substrate 101 (i.e., perpendicular to the plane of the drawing) at intervals of 50 $\mu$m; electrodes 106 and 107 formed on each of the semiconductor crystal islands; and wiring sections for these electrodes. The heat resistant substrate 101 comprises a semiconductor monocrystal substrate, such as an Si monocrystal substrate or a GaAs monocrystal substrate, an amorphous substrate, such as a quartz substrate or a ceramic substrate, a high-melting-point metal substrate, such as a W substrate or a Ti substrate, or the like. As shown in FIG. 2, a nucleation layer 103 consisting of a non-monocrystalline material, such as $Al_2O_3$ or $Ta_2O_5$, which has a high nucleation density, and a non-nucleation layer 102 of a non-monocrystalline material, such as $SiO_2$ or $SiN_x$, are deposited in that order on the heat resistant substrate 101 by electron beam evaporation, resistance heating evaporation, sputtering, or the like.

Figure 3:
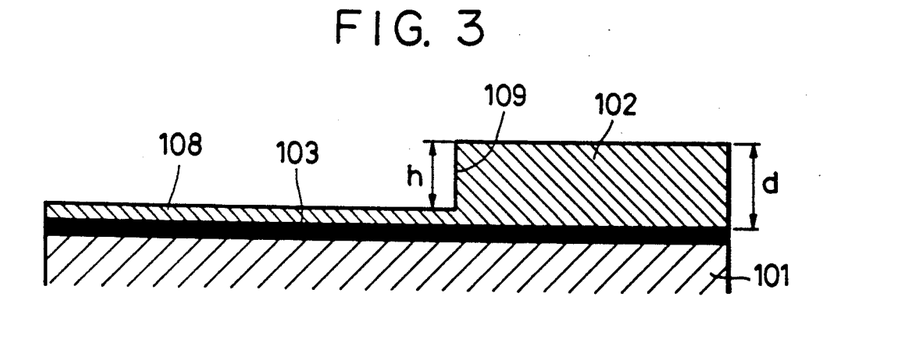
FIG. 3 is a sectional view showing how a step is formed on an amorphous, layer.
Figure 4:
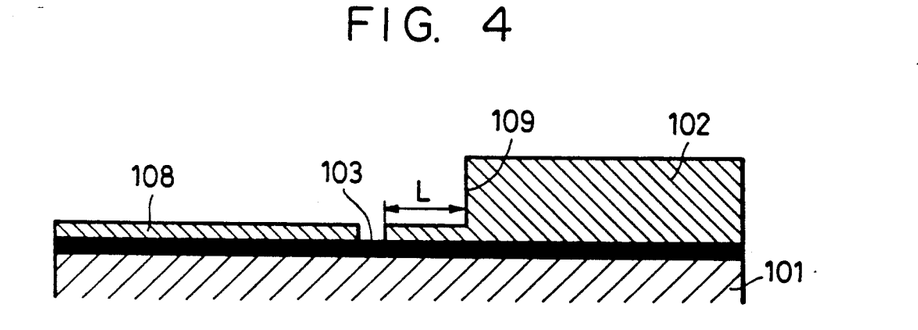
FIG. 4 is a sectional view showing how a nucleation layer 103 is partly exposed.
Figure 25:
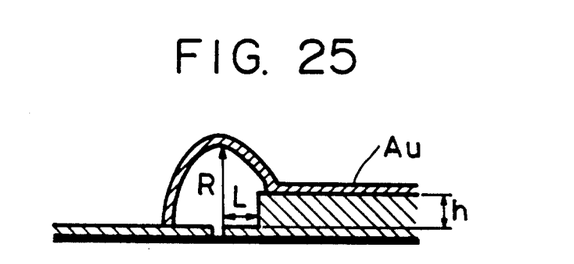
FIG. 25 is a diagram showing the parameters used in FIG. 24.

Subsequently, as shown in FIG. 3, a step is formed on the surface of the non-nucleation layer 102. Here, the thickness d of the non-nucleation layer 102 and the height h of the step are determined such that $d > h$ so that the nucleation layer 103 is not exposed on the surface of the non-nucleation layer 102 at this stage. Then, as shown in FIG. 4, minute parts of the layer portion 108, which comprises the lower layer portion of the non-nucleation layer 102, 108, are removed to partly expose the nucleation layer 103. The area of each of the parts of the nucleation layer 103 thus exposed is generally 10 $\mu$m square or less, more preferably 6 $\mu$m square or less, and most preferably, 3 $\mu$m square or less. Further, assuming, as shown in FIG. 25, that the minimum distance between the center of each exposed area of the nucleation layer 103 and the boundary of the step is L, and that the distance between each of the exposed surfaces of the nucleation layer 103 and the top surface of the corresponding semiconductor crystal island, on which electrodes are formed, is R (see FIG. 25), the following relationship holds true:

$$L < R, R - 8 \mu m < h, \text{ and } h < (R - L) + 2 \mu m$$

Figure 5:
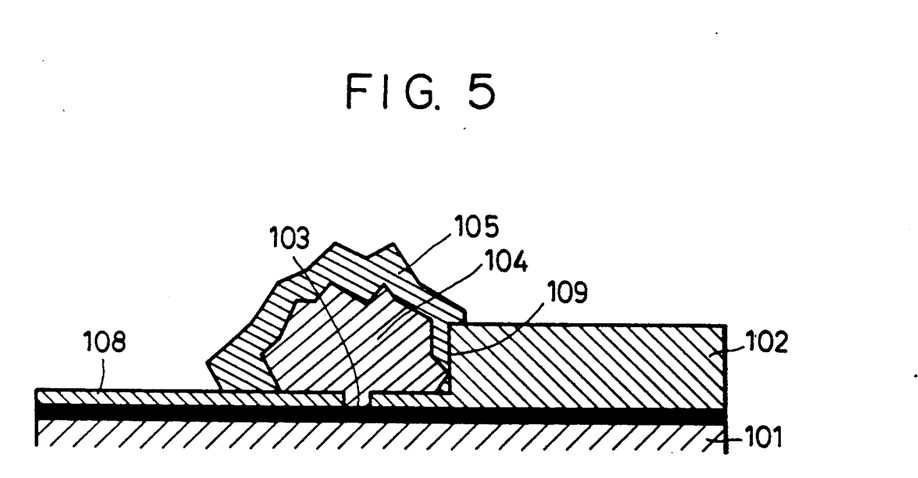
FIG. 5 is a sectional view showing the formation of a compound semiconductor crystal island.

Next, as shown in FIG. 5, a p-type semiconductor region 104 and an n-type semiconductor region 105, having opposite conductivity, are successively formed by the metal organic chemical vapor deposition (MOCVD) method, using the exposed areas of the nucleation layer 103 as the starting points. Here, the n and p types may be reversed. Examples of the semiconductor material used include: TMG (trimethyl gallium), TEG (triethyl gallium), TMA (trimethyl aluminum), TEA (triethyl aluminum), TMIn (trimethyl indium), TEIn (triethyl indium), TBAs (tertiary butyl arsine), TMAs (trymethyl arsine), TEAs (triethyl arsine), DMAs (dimethyl arsine), DEAs (diethyl arsine), $AsH_3$, TBP (tertiary butyl phosphine), TMP (trimethyl phosphine), TEP (triethyl phosphine), $PH_3$, and $NH_3$. Examples of the doping material include: DMSe (dimethyl selenium), DMTe (dimethyl tellurium), DETe (diethyl tellurium), $SiH_4$, DEZn (diethyl zinc), Cp2Mg (cyclopentane magnesium), and (MeCp)2MG (methyl cyclopentane magnesium).

Figure 6:
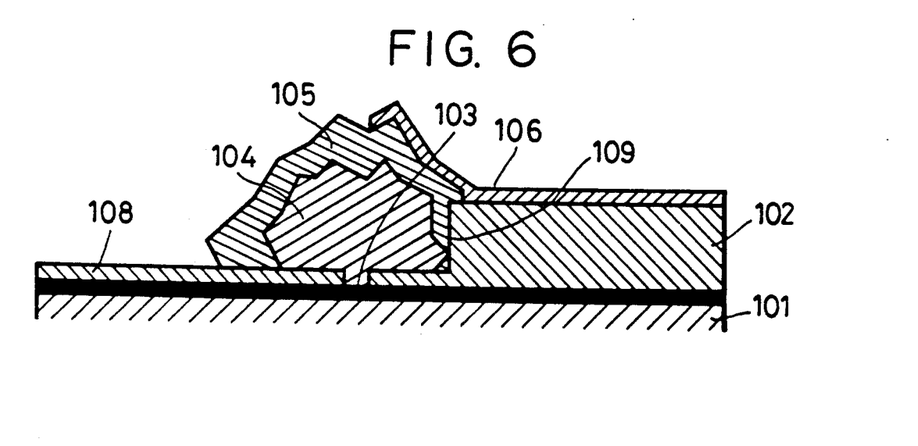
FIG. 6 is a sectional view showing the formation of an external electrode 106.
Figure 7:
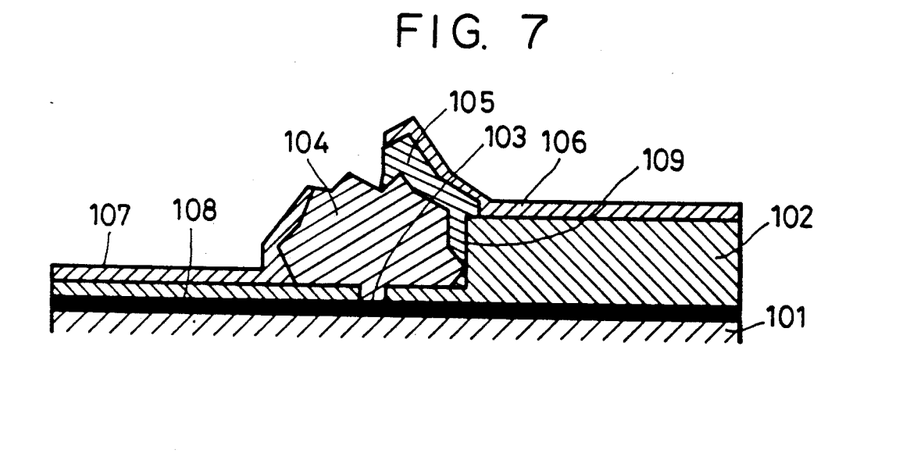
FIG. 7 is a sectional view showing the formation of an internal electrode 107.

Next, as shown in FIG. 6, an electrode 106 is formed by resistance heating, electron beam heating or the like. Subsequently, as shown in FIG. 7, that portion of each n-type semiconductor region 105 which is not covered with the electrode 106 is removed by dry etching or wet etching to expose a part of the p-type semiconductor region 104, on which another electrode 107 is formed.

Figure 8:
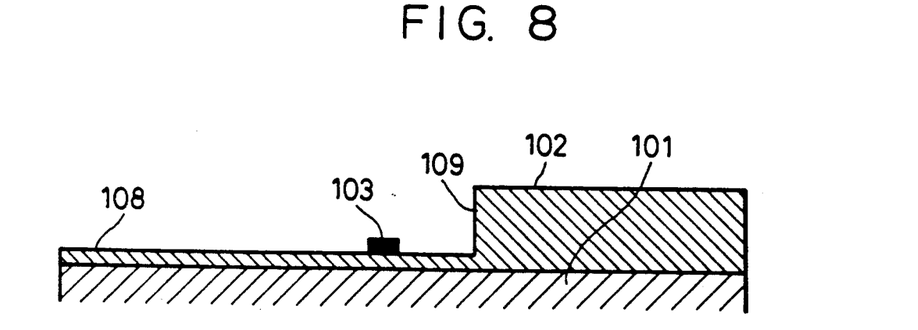
FIG. 8 is a sectional view showing a nucleation layer 103 arranged on a non-nucleation layer portion 108.
Figure 9:
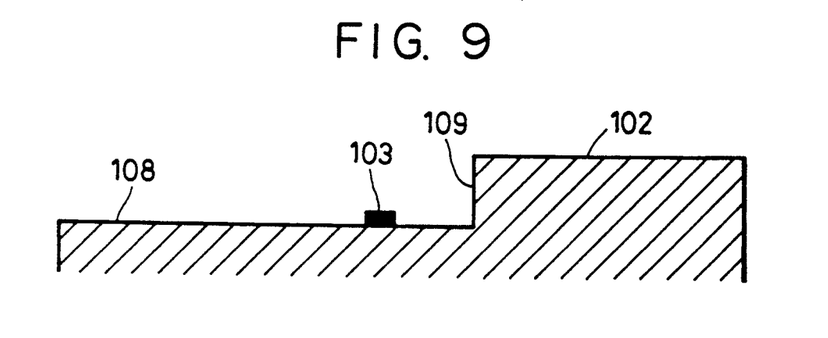
FIG. 9 is a sectional view showing a heat resistant substrate as the non-nucleation layer 102, 108.

In addition to the above-described method, there are other methods of forming the nucleation layer 103, the non-nucleation layer 102, 108, and the step thereon. For example, as shown in FIG. 8, it is possible to form the non-nucleation layer 102, 108, consisting of a non-mononcrystalline material such as $SiO_2$ or $SiN_x$ which has a low nucleation density, on the heat resistant substrate 101 by thermal oxidation, evaporation, sputtering, or the like, and then forming the step thereon in such a manner that the heat resistant substrate 101 is not exposed. Alternatively, it is possible, as shown in FIG. 9, to use a substrate having a low nucleation density, such as a quartz substrate, as the heat resistant substrate, and then forming the step directly thereon In these cases, it is necessary to form the nucleation layer 103 as a minute region on the lower portion 108 of the non-nucleation layer. For this purpose, a layer of a material having a high nucleation density, such as $Al_2O_3$ or $Ta_2O_5$, is formed on the non-nucleation surfaces 102 and 108 of a non-monocrystalline material, such as $SiO_2$ or $SiN_x$, by electron beam evaporation, resistance heating evaporation, or the like. Subsequently, the layer thus formed is removed by reactive ion beam etching (RIBE), ion beam etching (IBE) or the like, generally leaving the nucleation layer 103 consisting of minute regions. Alternatively, it is possible to inject ions of Al, As or the like into minute regions by using a focus ion beam (FIB), using these regions as the nucleation layer 103. Further, it is also possible to cause ions of Al, As or the like to strike minute regions, with the remaining portions of the layer being masked, and to remove the mask afterwards, thus effecting an increase in nucleation density in these minute regions only.

Figure 10:
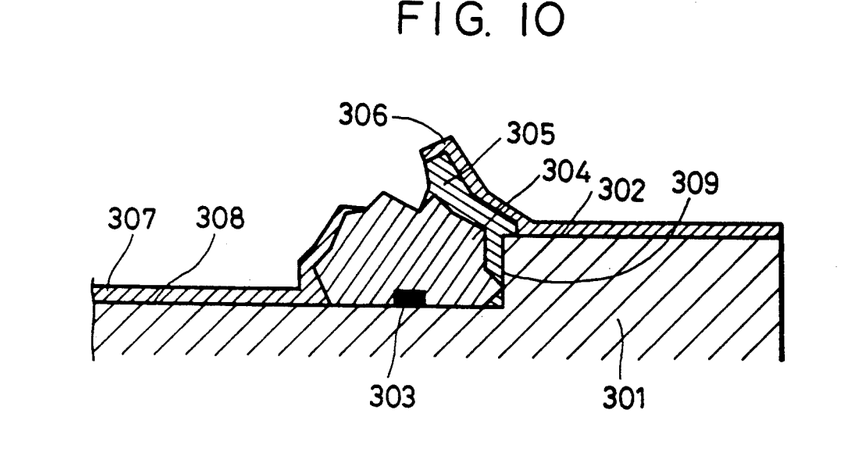
FIG. 10 is a sectional view of a light emitting device according to a second embodiment of the present invention.

FIG. 10 is a sectional view of a second embodiment of the present invention, which uses a substrate of the type shown in FIG. 9. FIGS. 11 to 16 are sectional views illustrating fabrication steps for the light emitting device shown in FIG. 10.

As shown in FIG. 10, the light emitting device of this embodiment comprises: a base consisting of an Si substrate 301 in which a heat resistant substrate and non-nucleation surfaces 302 and 308 which form a step defined by a wall surface 309, are formed as one piece, and a plurality of nucleation regions 303 made of $Al_2O_3$ each having a size of 3 μm × 3 μm; a plurality of compound semiconductor crystal islands each comprising an n-type semiconductor region 304 made of n-GaAs, a p-type semiconductor region 305 made of p-GaAs; Au electrodes 306 and 307 connected to each semiconductor crystal island; and wiring sections for these electrodes.

Figure 11:
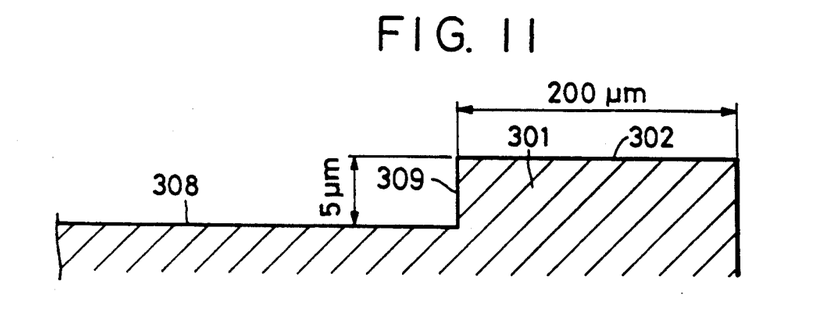
FIG. 11 is a sectional view of a substrate 301 of the second embodiment.
Figure 12:
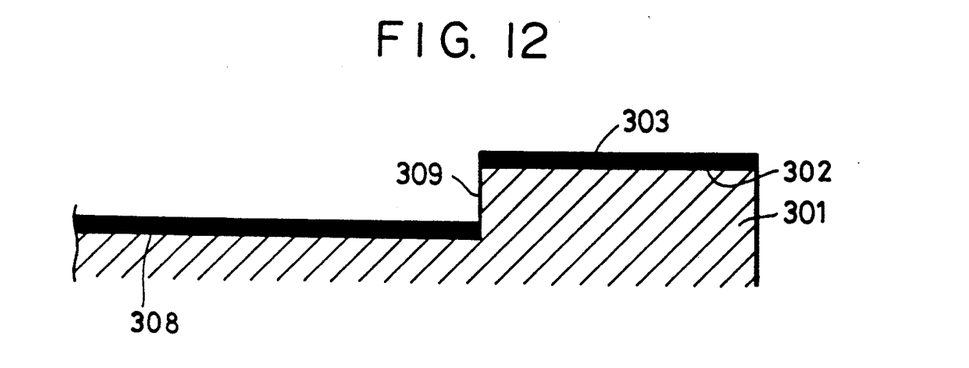
FIG. 12 is a sectional view showing the deposition of a nucleation-layer material.
Figure 13:
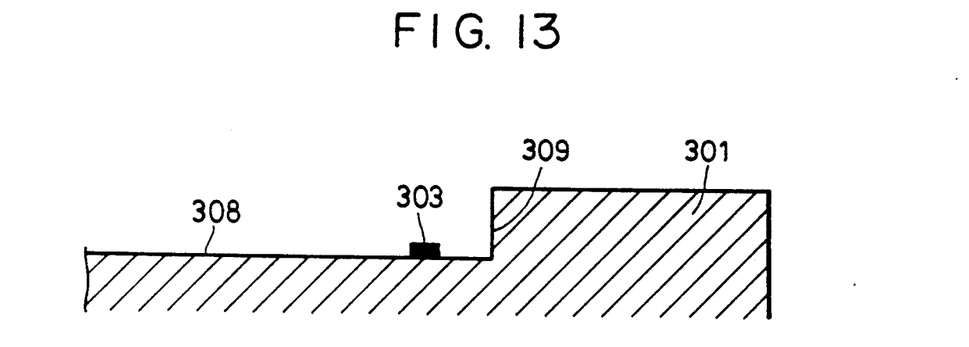
FIG. 13 is a sectional view showing the formation of a nucleation layer 303.

As shown in FIG. 11, the above-mentioned base is formed by dry etching the substrate 301 to a depth of 5 μm to leave a portion having a width of 200 μm in the longitudinal direction of the substrate (which is perpendicular to the plane of this sectional view) on the surface of the quartz substrate 301 to define the non nucleation surfaces 302 and 308 (shown in FIG. 10). Next, as shown in FIG. 12, $Al_2O_3$ is deposited by electron beam evaporation on the non-nucleation surfaces 302 and 308 to a thickness of 0.1 μm to form a nucleation layer 303, and then the $Al_2O_3$ is partly removed by wet etching in such a manner that minute $Al_2O_3$ regions, each 3.5 μm square, remain on the non-nucleation surface 308, the minute regions being arranged in the longitudinal direction of the substrate 301 at intervals of 50 μm.

Figure 14:
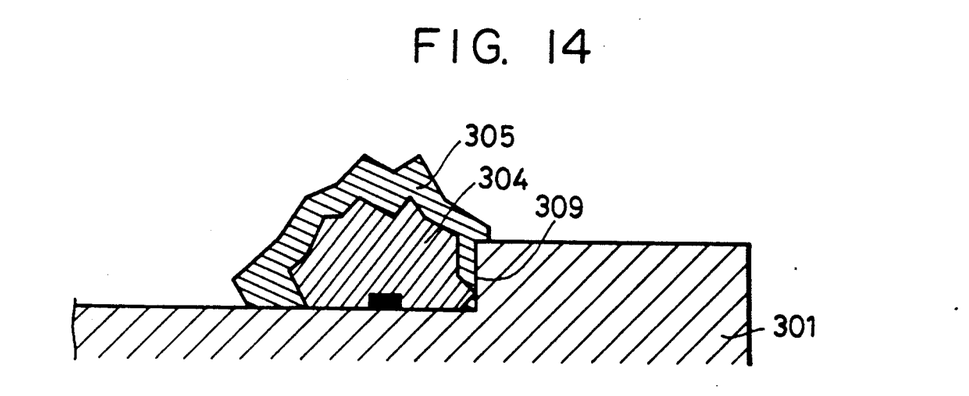
FIG. 14 is a sectional view showing the formation of a semiconductor crystal island.

Next, as shown in FIG. 14, an n-type GaAs polycrystal (n = 1 × $10^{18}$cm$^{-3}$) and a p-type GaAs polycrystal (n = 1 × $10^{18}$cm$^{-3}$) are grown on each of the minute regions and correspond to the n-type semiconductor region 304 and the p-type semiconductor region 305, respectively.

Figure 15:
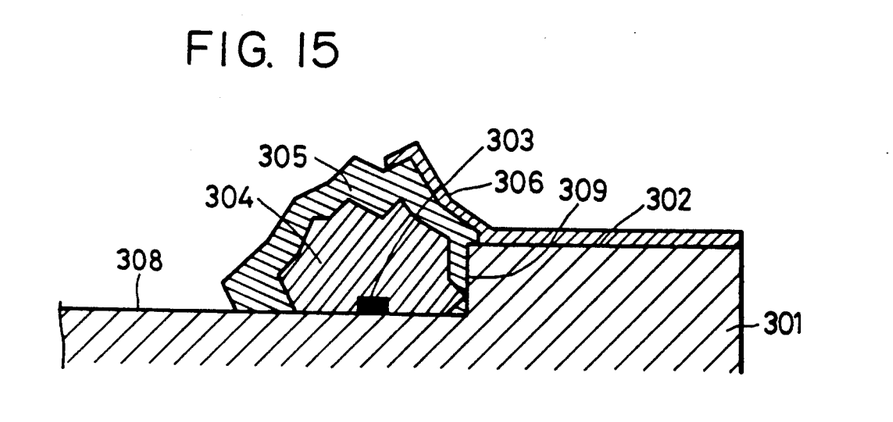
FIG. 15 is a sectional view showing the formation of an external electrode 306.
Figure 16:
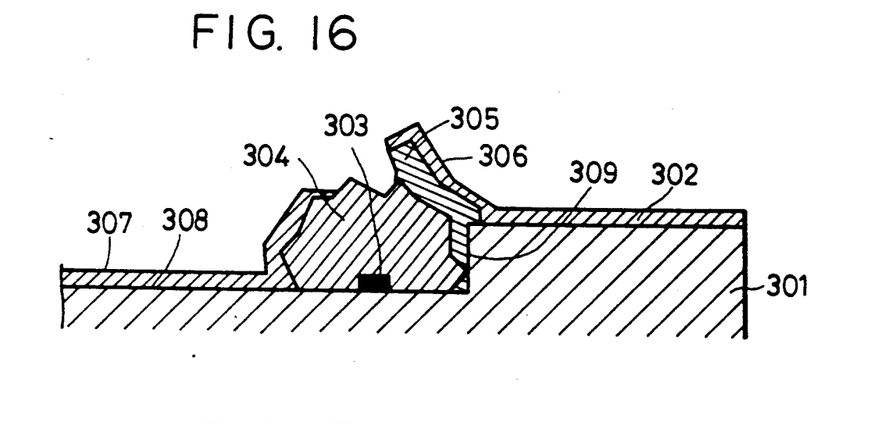
FIG. 16 is a sectional view showing the formation of an internal electrode 307.

Subsequently, as shown in FIG. 15, one of the electrodes 306 is formed on the upper surface of each p-type semiconductor region 305 by depositing Cr(500A)-/Au(5000A) by resistance heating evaporation. Then, as shown in FIG. 16, using the electrodes 306 as a mask, etching is performed to such an extent that the n-type GaAs of the n-type semiconductor regions 304 is partly exposed, and AuGe(2000A)/Au(5000A) is deposited on the exposed portions of the n type GaAs by resistance evaporation, thereby forming the electrodes 307. Then, the electrode wiring sections for these electrodes are provided on the non-nucleation surfaces 302 and 308. In this embodiment, the variation in the resistance of the light emitting device which, in the prior art, is 30 to 300 Ω, can be reduced to 25 to 100 Ω.

Next, a light emitting device according to a third embodiment of the present invention will be described.

Figure 17:
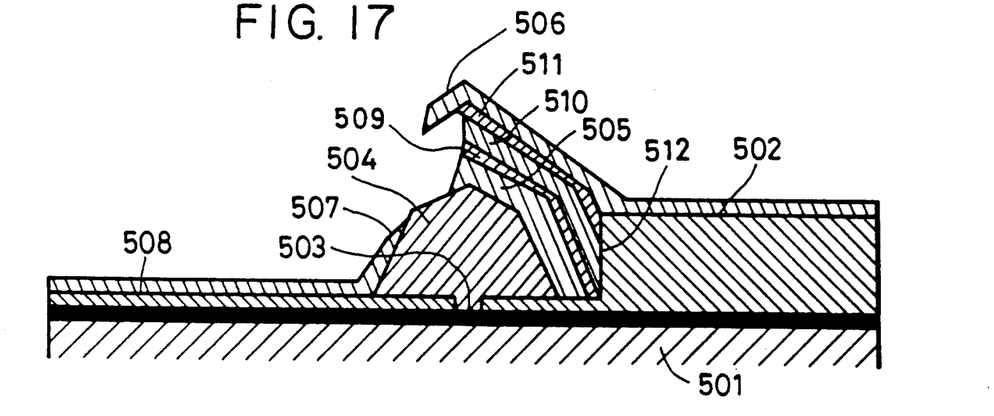
FIG. 17 is a sectional view of a light emitting device according to a third embodiment of the present invention.

FIG. 17 is a sectional view of one of the semiconductor crystal islands in the third embodiment; and FIGS. 18 to 23 are sectional views showing the fabrication steps thereof.

This light emitting device comprises: a base consisting of a heat resistant substrate 501, a non-nucleation layer having two layer portions 502 and 508, forming a step defined by a wall surface 512, and a plurality of nucleation regions 503; a plurality of compound semiconductor crystal islands each comprising n-type semiconductor regions 504 and 505, a non-doped semiconductor region 509, and p-type semiconductor regions 510 and 511; electrodes 506 and 507 formed thereon; and wiring sections for these electrodes.

Figure 18:
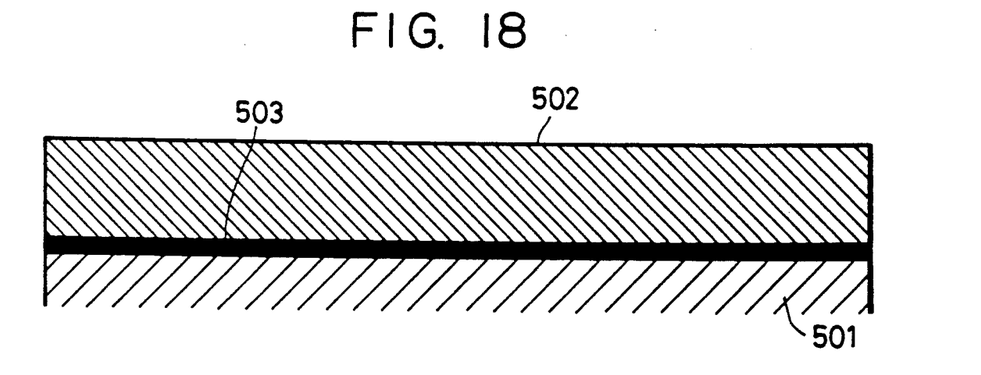
FIG. 18 is a sectional view showing the deposition of the materials of a nucleation layer 503 and a non-nucleation layer 502 in the third embodiment.

As shown in FIG. 18, the heat resistant substrate 501 is an Si substrate, on which is deposited by electron beam evaporation a nucleation layer 503 consisting of an AlN layer having a thickness of 0.1 μm, and a non-nucleation layer 502 consisting of an $SiO_2$ layer having a thickness of 5 μm.

Figure 19:
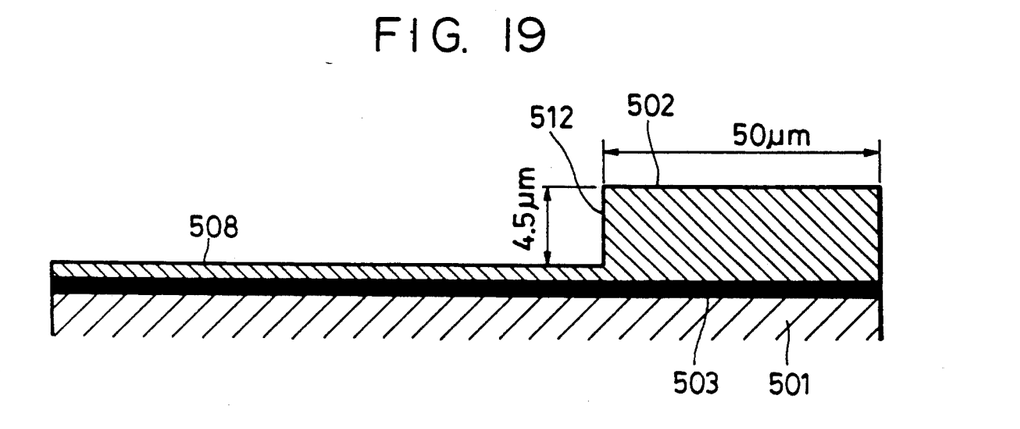
FIG. 19 is a sectional view showing the formation of a step.

Then, as shown in FIG. 19, the non-nucleation layer 502 is partly removed by dry etching to a depth of 4.5 μm in such a manner as to leave non-nucleation layer portions each having a width of 50 μm and arranged in the longitudinal direction of the substrate (which is perpendicular to the plane of this sectional view) at intervals of 300 μm, thereby defining separate non-nucleation layer portions 502 and 508.

Figure 20:
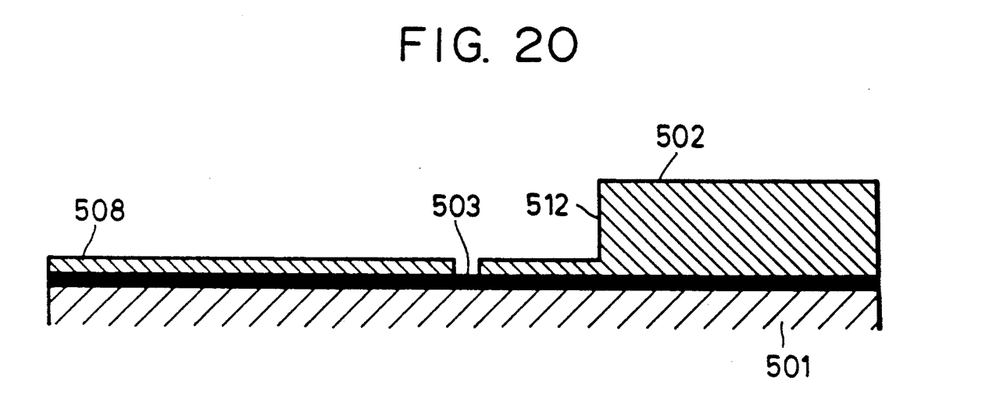
FIG. 20 is a sectional view illustrating a part of the nucleation layer 503 exposed.

Subsequently, as shown in FIG. 20, minute holes of 1.2 μm square are formed by dry etching in the non-nucleation layer portion 508, at positions each 10 μm away from the boundary wall 512 between the non-nucleation layer portions 502 and 508, so as to be arranged parallel with the longitudinal direction of the non-nucleation layer portions 502 at intervals of 50 μm, thereby partly exposing the nucleation layer 503. In this way, the above-mentioned base is prepared.

Figure 21:
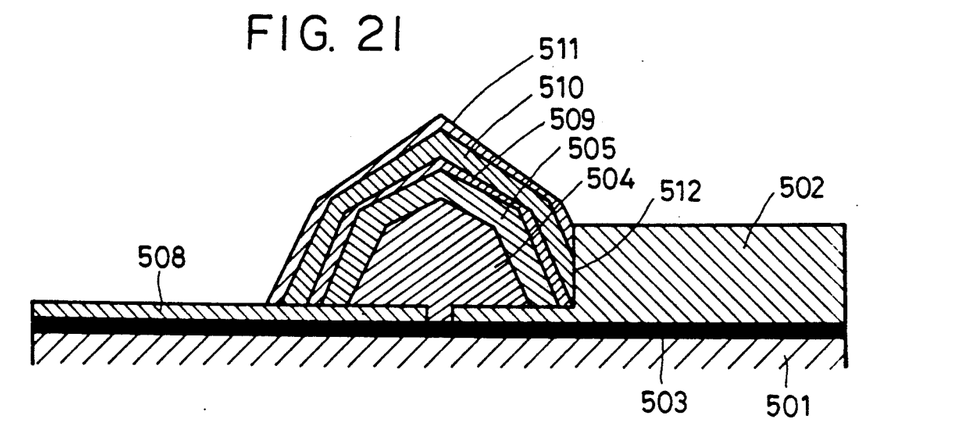
FIG. 21 is a sectional view showing the formation of a compound semiconductor island.

Then, as shown in FIG. 21, a compound semiconductor island is grown by the MOCVD method on each of the exposed areas of the nucleation layer 503, each island comprising an n-type GaAs monocrystal portion (n = 1 × $10^{18}$cm$^{-3}$) as the n-type semiconductor region 504, an n-type Al0.5 Ga0.5 As monocrystal portion (n = 5 × $10^{17}$cm$^{-3}$) as the n-type semiconductor region 505, a p-type Al0.5 Ga0.5 As monocrystal portion (n = 5 × $10^{17}$cm$^{-3}$) as the p-type semiconductor region 510, and a p type GaAs monocrystal portion (n $= 1 \times 10^{18} \text{cm}^{-3}$) as the p-type semiconductor region 511.

Figure 22:
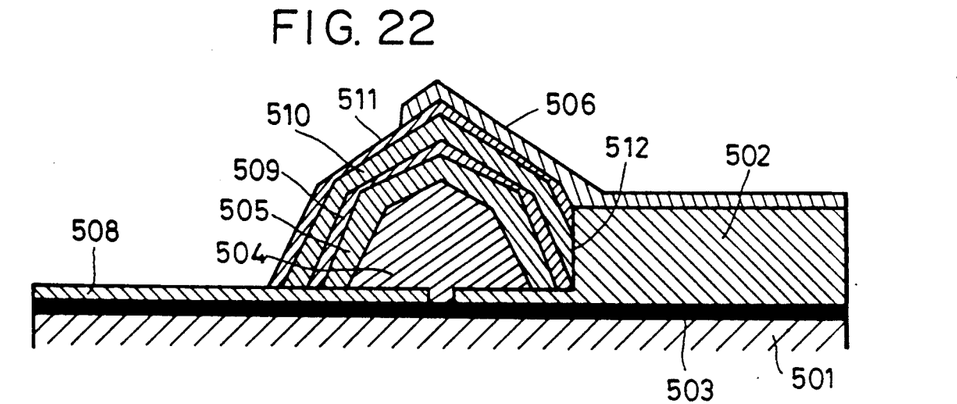
FIG. 22 is a sectional view showing the formation of an external electrode 506.
Figure 23:
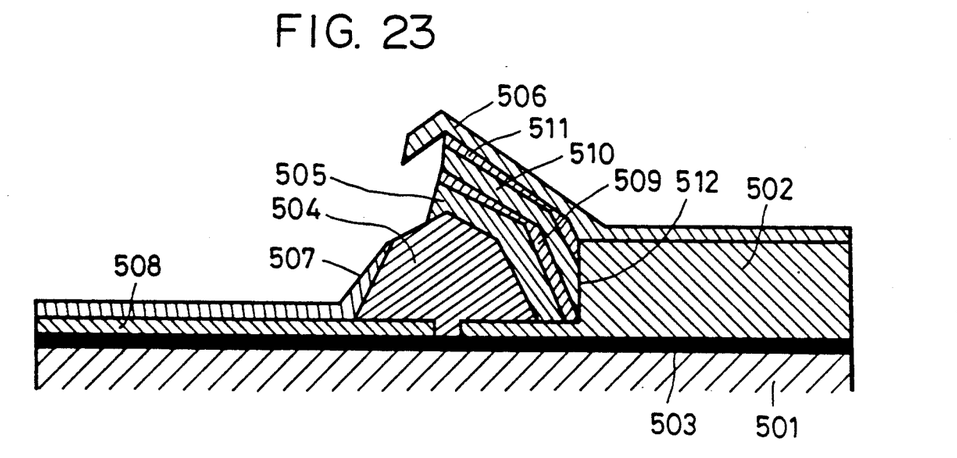
FIG. 23 is a sectional view showing the formation of an internal electrode 507.

Next, as shown in FIG. 22, Cr(500Å)/Au(5000Å) is deposited by resistance heating evaporation in such a manner as to cover both the surfaces of the outermost layers, i.e., the p-type semiconductor regions 511 and the surfaces of the non-nucleation layer portions 502, thereby forming electrodes 506. Afterwards, as shown in FIG. 23, using the electrodes 506 as a mask, etching is performed to such an extent that the n-type GaAs monocrystal portions constituting the n type semiconductor regions 504 are partly exposed, and AuGe(20-00Å)/Au(5000Å) is deposited on the surfaces of the exposed portions of the n-type GaAs layers and the surface of the non-nucleation layer portions 508 to form the electrodes 507. In this way, the light emitting device of the third embodiment of the invention is formed.

Further, changes in the resistance of the electrode wiring were experimentally ascertained using as the parameters the height h of the step, the distance L between each starting point of crystal formation, and the height R of each semiconductor crystal island of the light emitting device, as shown in FIG. 25.

In the experiment, three substrates were prepared, each comprising a heat resistant Si substrate and an Al$_2$O$_3$ layer as a nucleation layer deposited thereon to a depth of 0.1 μm by electron beam evaporation and an SiO$_2$ layer as a non-nucleation layer deposited on the Al$_2$O$_3$ layer to depths of 2.2 μm, 6.2 μm and 8.2 μm, respectively. Here, the evaporation was conducted in a vacuum of $1 \times 1E$ 6 Torr while supplying oxygen at a rate of 10 cc/min.

Subsequently, formed on the surface of each of the three substrates were stripe-like recesses extending in the longitudinal direction of the substrate and arranged at intervals of 1 μm. Nine types of recesses were prepared, the widths thereof ranging from 2 μm to 10 μm. The steps of these recesses were formed by removing the SiO$_2$ layer perpendicularly to the substrate to the extent that the thickness of the portion left after the removal was 0.2 μm. The removal of the SiO$_2$ was effected by dry etching, which was conducted while supplying CF$_4$ and O$_2$ at rates of 20 cc/min. and 2 cc/min., respectively, and under the conditions of a pressure of 1 Torr and a discharge of 100W.

Then, minute Al$_2$O$_3$ regions, each 2 μm square, were formed on the central line of each of the recesses, at intervals of 50 μm. The formation of the minute Al$_2$O$_3$ regions was effected by performing dry etching for five minutes on the SiO$_2$ layer.

Next, by using the MOCVD method, GaAs polycrystal growth was effected at a V/III ratio of 40 while supplying AsH$_3$ constantly at a rate of $1.8 \times 10^{-5}$ mol/min. The III-Group material used was TMG (trimethyl gallium). H$_2$ was supplied as a carrier gas at a rate of 10 l/min. The substrate temperature was 670° C., the pressure was 20 Torr, and the growth time was 70 minutes.

Subsequently, Au lines having a width of 10 μm (and a thickness of 5000Å) were arranged perpendicularly to the recesses on the substrate in such a manner as to overlap the semiconductor crystal islands, thus forming electrode wiring.

Figure 24:
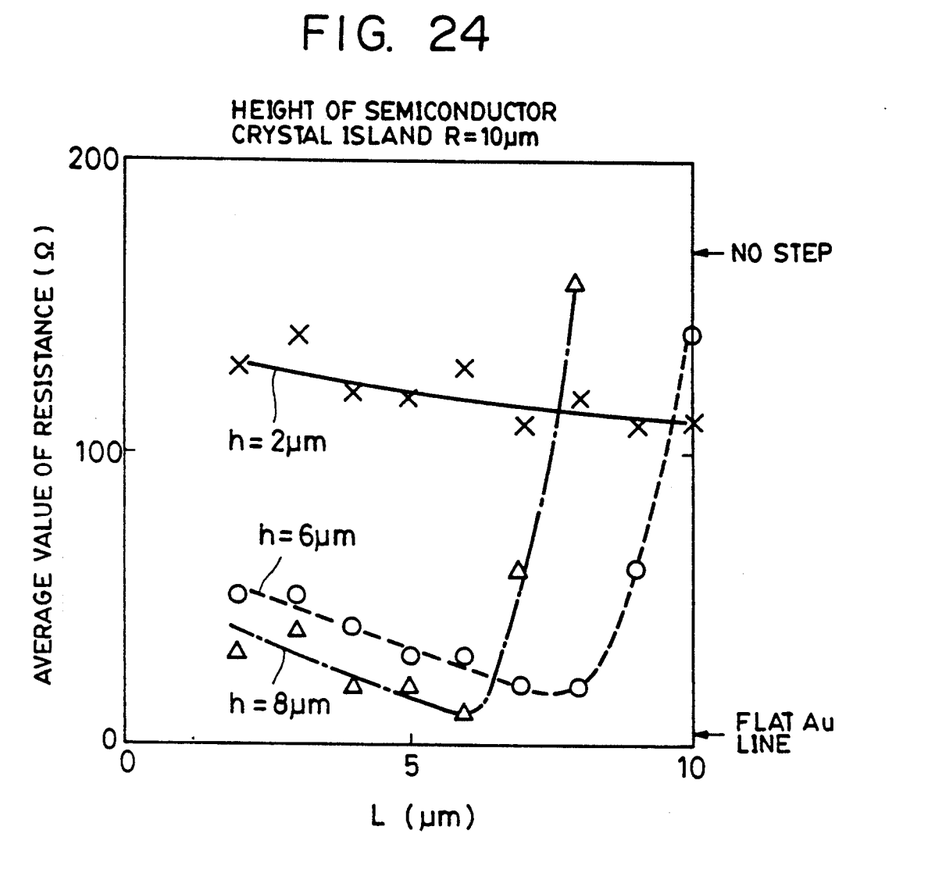
FIG. 24 is a diagram showing the effect of the step on the value of resistance of the electrode wiring for different distances between the step and the crystal growth starting point.

Thirty Au lines formed in the manner as described above were measured for their resistance. FIG. 24 shows the ratio of the Au lines exhibiting an average resistance value. For comparison, the diagram also shows the average resistance value 3Ω of Au lines formed on a flat substrate surface and the average resistance value 170Ω when h = 0 (where the substrate surface has no steps but has semiconductor crystal islands).

From the results of the experiment, the step height h > 2 μm, and $$(R - L) > h - 2 \mu m.$$

Thus, a resistance reducing effect due to the steps was observed.

As described above, according to the present invention, a step is formed on the non-nucleation surface of a light emitting device array prepared by the selective nucleation method, and compound semiconductor crystal islands are grown along the wall surface of the step, and further, the wiring section for the outer electrodes is formed on the surface of the non-nucleation layer portion which is at a higher level, thereby reducing the resistance of the electrode wiring and making the electrode wiring relatively resistant to disconnection during production and use.

While the present invention has been described with respect to what is presently considered to be the preferred embodiments, it is to be understood that the invention is intended to cover various modifications and equivalent arrangements included within the sphere and scope of the appended claims. The scope of the following claims is to be accorded the broadest interpretation so as to encompass all such modifications and equivalent structures and functions.

We claim:

1. A light emitting device comprising:
   a non-nucleation base layer including a first layer portion having an arbitrarily determined thickness as measured from a bottom surface of said first layer portion, a second layer portion having a thickness greater than that of said first layer portion, and a wall surface connecting said first and second layer portions, thereby forming a step;
   a plurality of compound semiconductor crystal islands grown at a plurality of locations along said first layer portion and said wall surface from at least one of points on said first layer portion adjacent to the wall surface and points on said wall surface;
   a plurality of light emitting regions formed on areas corresponding to concentric circles around each location at which said compound semiconductor crystal islands are grown;
   electrodes disposed outside said light emitting regions, thereby forming electrode regions; and
   a wiring section formed on said second layer portion.

2. A light emitting device according to claim 1, wherein a thickness of said first layer portion is substantially uniform with a range of at least 50 μm of said light emitting regions.

3. A light emitting device according to claim 1, wherein a thickness of said first layer portion is substantially uniform within a range of at least 100 μm of said light emitting regions.

4. A light emitting device according to claim 1, wherein said compound semiconductor crystal islands are grown up to a height of said second layer portion, the electrode region outside said light emitting region being substantially at the same level as said wiring section formed on said second layer portion.

5. A light emitting device according to claim 1, wherein said compound semiconductor crystal islands are formed from a monocrystalline material.

6. A light emitting device according to claim 1, wherein said compound semiconductor crystal islands are formed from a polycrystalline material.

* * * * *

UNITED STATES PATENT AND TRADEMARK OFFICE
CERTIFICATE OF CORRECTION

PATENT NO. : 5,250,819
DATED : October 5, 1993
INVENTOR(S) : HIDEJI KAWASAKI, et al.

It is certified that error appears in the above-identified patent and that said Letters Patent is hereby corrected as shown below:

<u>COVER PAGE</u>
At [56], "60-08384" should read --60-48384--.

<u>COLUMN 2</u>
Line 28, "non nucleation" should read --non-nucleation--.
Line 59, "amorphous," should read --amorphous--.

<u>COLUMN 5</u>
Line 14, "thereon" should read --thereon.--.

<u>COLUMN 7</u>
Line 30, "1 X 1E6 Torr" should read --1 X 1E-6 Torr--.

Signed and Sealed this

Tenth Day of May, 1994

*Attest:*

BRUCE LEHMAN

*Attesting Officer*  *Commissioner of Patents and Trademarks*